United States Patent
Tsai et al.

(10) Patent No.: US 10,868,496 B1
(45) Date of Patent: Dec. 15, 2020

(54) OSCILLATOR CIRCUITS AND METHODS FOR REALIGNMENT OF AN OSCILLATOR CIRCUIT

(71) Applicant: Taiwan Semiconductor Manufacturing Company Limited, Hsinchu (TW)

(72) Inventors: Tsung-Hsien Tsai, Taoyuan County (TW); Ruey-Bin Sheen, Taichung (TW); Chih-Hsien Chang, New Taipei (TW); Cheng-Hsiang Hsieh, Taipei (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 16/744,413

(22) Filed: Jan. 16, 2020

(51) Int. Cl.
| | |
|---|---|
| H03B 5/12 | (2006.01) |
| H03B 5/04 | (2006.01) |
| H03L 7/081 | (2006.01) |
| H03K 3/00 | (2006.01) |
| H03B 17/00 | (2006.01) |
| H03L 7/26 | (2006.01) |
| H03K 5/156 | (2006.01) |

(52) U.S. Cl.
CPC ............. *H03B 5/1203* (2013.01); *H03B 5/04* (2013.01); *H03B 17/00* (2013.01); *H03K 3/00* (2013.01); *H03K 5/1565* (2013.01); *H03L 7/0814* (2013.01); *H03L 7/26* (2013.01)

(58) Field of Classification Search
CPC ........ H03B 17/00; H03B 5/1203; H03B 5/04; H03L 7/26; H03L 7/0814; H03L 7/06; H03K 5/1565; H03K 3/00; H03K 21/00
USPC ........... 331/167, 117 FE; 327/295, 291, 175, 327/176
See application file for complete search history.

(56) References Cited

U.S. PATENT DOCUMENTS

| | | | |
|---|---|---|---|
| 7,339,439 B2* | 3/2008 | Roubadia | H03K 3/0315 331/11 |
| 9,077,512 B2* | 7/2015 | Olejarz | H03L 7/0805 |
| 9,800,249 B2* | 10/2017 | Rajavi | H03L 7/18 |

\* cited by examiner

*Primary Examiner* — Arnold M Kinkead
(74) *Attorney, Agent, or Firm* — Jones Day (57) ABSTRACT

Oscillators and methods for realignment of an oscillator are provided. An oscillator includes an inductor having first and second terminals and a capacitor electrically coupled in parallel to the inductor at the first and second terminals. A first transistor of a first conductivity type is electrically coupled to the first terminal and a voltage source. The first transistor includes a gate configured to receive a first realignment signal. When the first realignment signal is in a realignment state, the first transistor is turned on and a voltage of the first terminal is increased from a low level to a high level in order to align a phase of a waveform of the oscillator.

20 Claims, 10 Drawing Sheets

OSCILLATOR CIRCUITS AND METHODS FOR REALIGNMENT OF AN OSCILLATOR CIRCUIT

BACKGROUND

Generally, an integrated circuit ("IC") is a circuit in which all or some of the circuit elements are inseparably associated and electrically interconnected so that it is considered to be indivisible. An IC is commonly embodied in a wafer. A wafer can be a slice or flat disk of semiconductor material or, for example, of semiconductor material deposited on a substrate, in which circuits or devices are simultaneously processed and, if there is more than one device, subsequently separated into dies. The wafer can have logic circuitry that forms a high-speed digital circuit, such as digital logic for a digital phase locked loop ("PLL") circuit, for example.

The digital PLL circuit may utilize an inductance-capacitance (LC) oscillator or another type of oscillator. An LC oscillator includes a parallel electrical connection between a capacitor element and an inductor element. This parallel connection results in an electrical resonator that stores energy oscillating at the circuit's resonant frequency.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

Corresponding numerals and symbols in the different figures generally refer to corresponding parts unless otherwise indicated. The figures are drawn to clearly illustrate the relevant aspects of the embodiments and are not necessarily drawn to scale.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in some various examples. This repetition is for the purpose of simplicity and clarity and does not in itself dictate a relationship between some various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device. Some of the features described below can be replaced or eliminated for different embodiments. Although some embodiments are discussed with operations performed in a particular order, these operations may be performed in another logical order.

Inductance-capacitance (LC) oscillators are commonly used in a variety of digital circuits, including digital phase locked loop circuits and others. LC oscillators, however, may exhibit poor phase noise performance, especially when fabricated according to modern, advanced processes (e.g., processes that feature relatively small feature sizes). Conventional solutions to improving phase noise performance in LC oscillators are undesirable because they involve using larger device sizes with higher power consumption. Under the approaches of the instant disclosure, phase noise in LC oscillators is improved by using realignment techniques that do not result in larger device sizes and higher power consumption. As described in detail below, the realignment techniques utilize a high-quality clock signal with low phase noise to realign a phase of the LC oscillator and remove accumulated jitter. The high-quality clock signal is converted into pulse signals with relatively narrow pulses, and the pulse signals are used to control realignment circuits that are coupled to terminals of the LC oscillator. The realignment circuits are used in aligning the phase of the LC oscillator and thus address phase noise issues.

Figure 1:
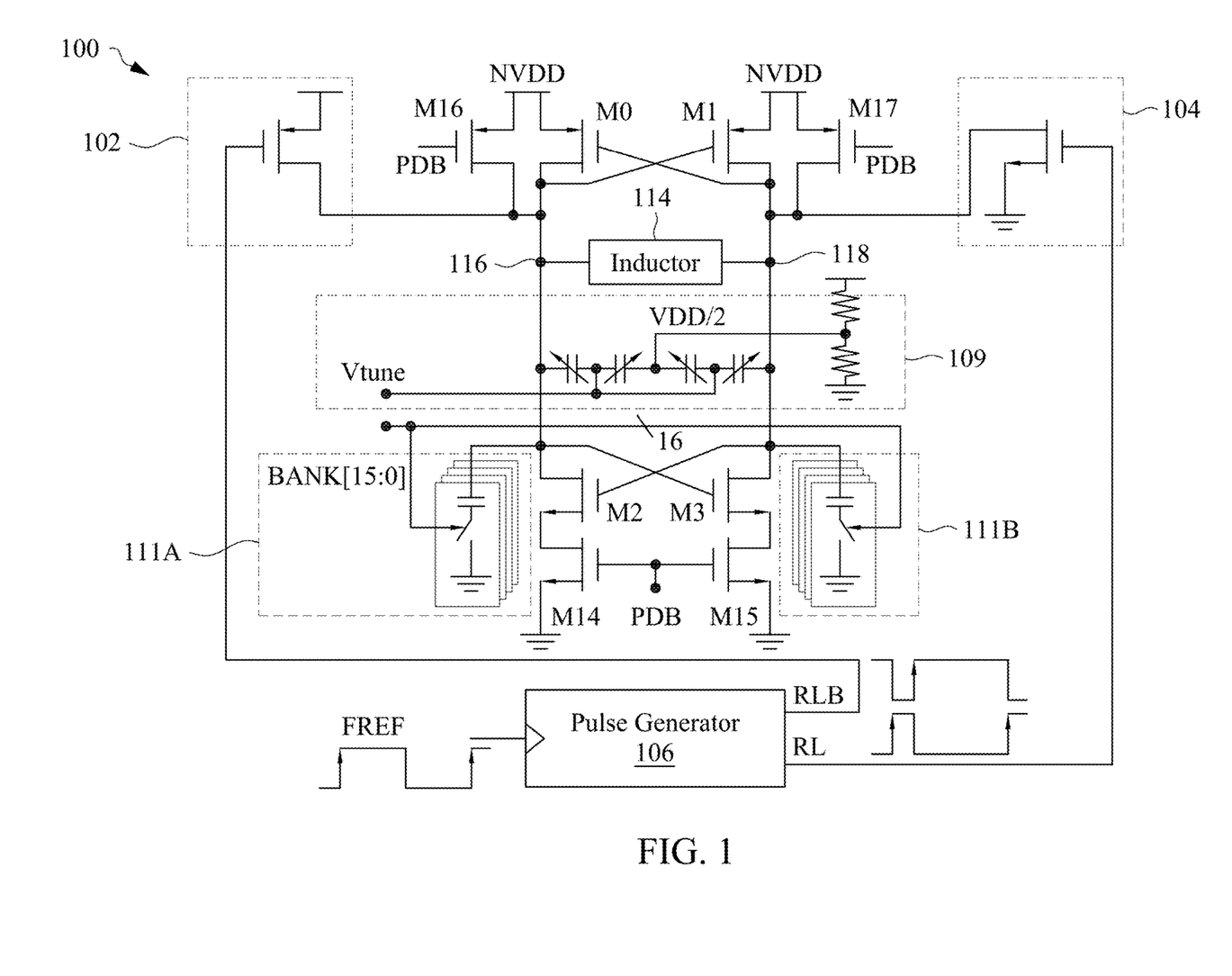
FIG. 1 is a schematic diagram of an oscillator, in accordance with some embodiments.

FIG. 1 is a schematic diagram of an oscillator 100, in accordance with some embodiments. The oscillator 100 includes an array of varactor capacitors 109, a metal-oxide-metal (MOM) capacitor array with banks of capacitors 111A, 111B, and an inductor 114 that define an oscillation frequency of the oscillator 100. As seen in FIG. 1, the inductor 114 has first and second terminals 116, 118. The array of varactor capacitors 109 and the MOM capacitor array with banks of capacitors 111A, 111B together form a capacitor that is electrically coupled in parallel to the inductor 114 at the first and second terminals 116, 118. The oscillator 100 of FIG. 1 may be referred to as an "LC tank oscillator" or "LC oscillator" because it is formed based on inductor and capacitor elements.

In some embodiments, the terminals 116, 118 oscillate (e.g., oscillate in voltage level) at a resonant frequency of the oscillator 100. A voltage Vtune is used to tune a resonant frequency of the oscillator 100. As seen in FIG. 1, the voltage Vtune is received by the array of varactor capacitors 109 and used to enable tuning of the resonant frequency over a relatively narrow frequency range. The MOM capacitor array with banks of capacitors 111A, 111B enables tuning of the resonant frequency of the oscillator 100 over a relatively wide frequency range.

PMOS transistors M0 and M1 of the oscillator 100 form a first cross-coupled pair. The gate terminal of transistor M0 is coupled to the drain terminal of transistor M1, and the gate terminal of transistor M1 is coupled to the drain terminal of transistor M0. The cross-coupled PMOS transistors M0 and M1 form a latch. As shown in FIG. 1, The source terminals of transistors M0 and M1 are coupled to node NVDD having operational voltage VDD. NMOS transistors M2 and M3 of the oscillator 100 form a second cross-coupled pair. The gate terminal of transistor M2 is coupled to the drain terminal of transistor M3, and the gate terminal of transistor M3 is coupled to the drain terminal of transistor M2. The cross-coupled NMOS transistors M2 and M3 form a latch.

NMOS transistors M14 and M15 function as current paths for the oscillator 100. The sizes of the transistors M14 and M15 and a voltage PDB provided to the gate terminals of the transistors M14 and M15 are selected to handle the currents flowing through the respective transistors M2 and M3. The ability of the transistors M14 and M15 to handle these currents is proportional to the voltage PDB and to the sizes of respective transistors M14 and M15. For example, if the voltage PDB is relatively large, then the transistors M14 and M15 can handle larger currents. By contrast, if the voltage VDB is relatively small, then the transistors M14 and M15 can handle smaller currents. Further, if the transistors M14 and M15 are larger transistors, then the transistors M14 and M15 can handle larger currents, and if the transistors M14 and M15 are smaller in size, then the transistors M14 and M15 can handle smaller currents. The voltage PDB is also received at the respective gate terminals of the PMOS transistors M16 and M17, as shown in FIG. 1. The PMOS transistors M16 and M17 have respective source terminals coupled to the node NVDD. The PMOS transistor M16 has a drain terminal coupled to the terminal 116, and the PMOS transistor M16 has a drain terminal coupled to the terminal 118.

Figure 2A:
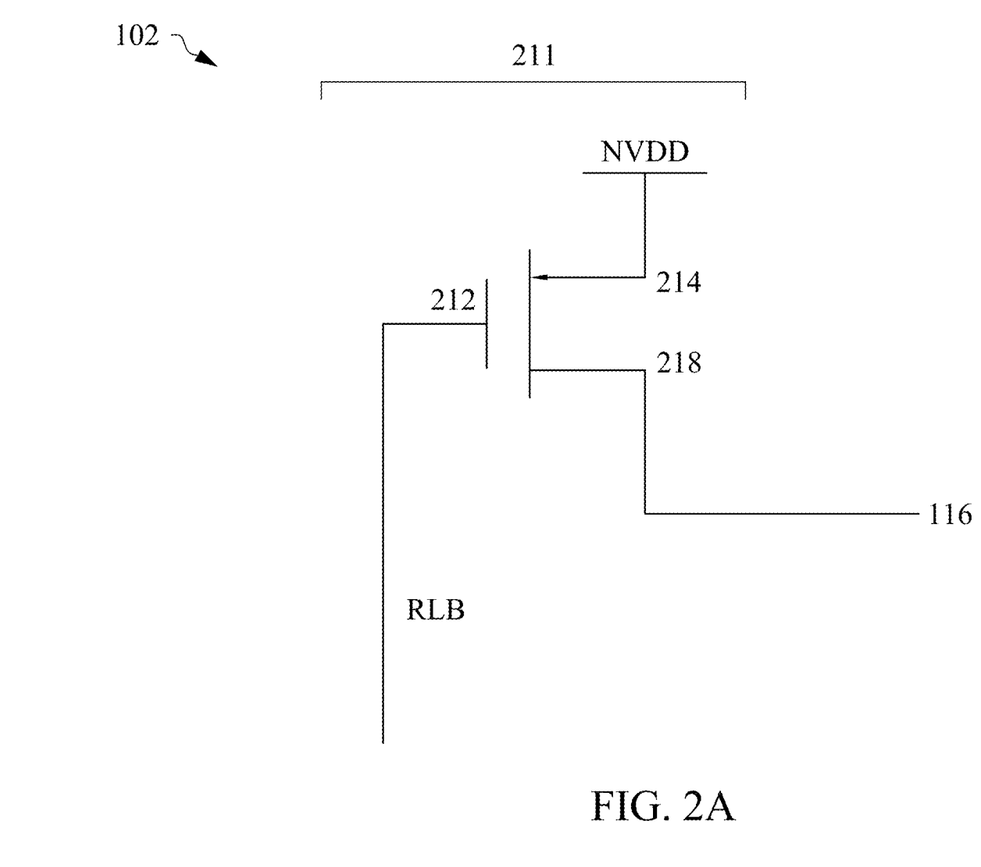
FIGS. 2A and 2B depict example realignment circuits, in accordance with some embodiments.

Under the approaches of the instant disclosure, the oscillator 100 of FIG. 1 uses a realignment technique to suppress in-band noise. Specifically, realignment of the oscillator 100 is enabled by realignment circuits 102, 104. The realignment circuit 102 includes a first transistor of a first conductivity type (e.g., PMOS), and the realignment circuit 104 includes a second transistor of a second conductivity type (e.g., NMOS). An example of the realignment circuit 102 is illustrated in FIG. 2A. In this figure, the realignment circuit 102 comprises a PMOS transistor 211, which has a gate terminal 212, a source terminal 214, and a drain terminal 218. The gate terminal 212 is configured to receive a first realignment signal RLB. The source terminal 214 is electrically coupled to a node NVDD having operational voltage VDD. The drain terminal 218 is electrically coupled to the oscillator 100 of FIG. 1 at the first terminal 116.

Figure 2B:
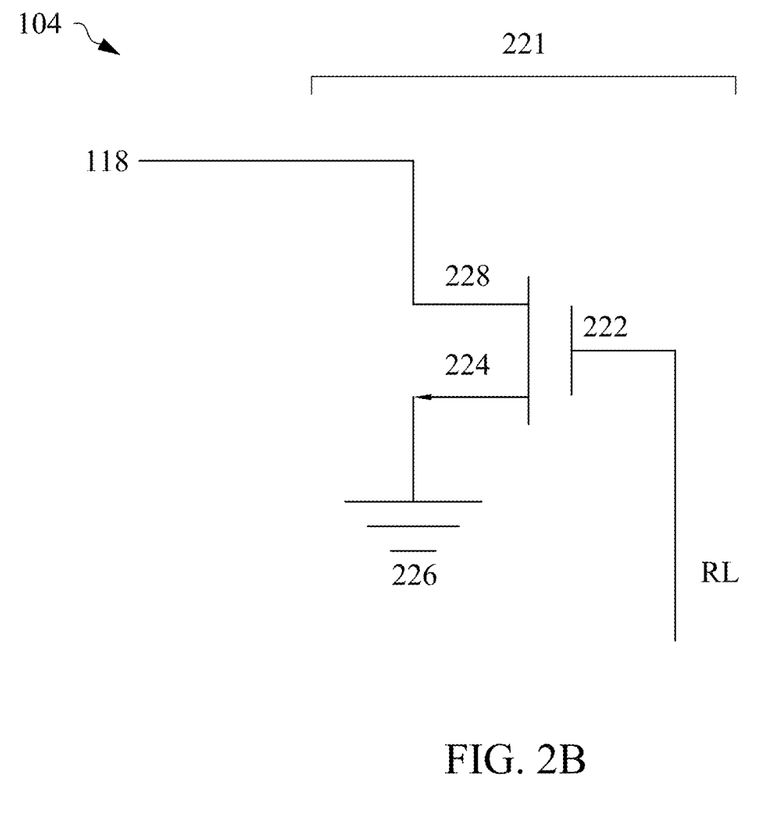

An example of the realignment circuit 104 is illustrated in FIG. 2B. In this figure, the realignment circuit 104 comprises an NMOS transistor 221, which has a gate terminal 222, a source terminal 224, and a drain terminal 228. The gate terminal 222 is configured to receive a second realignment signal RL. The source terminal 224 is electrically coupled to ground 226. The drain terminal 228 is electrically coupled to the oscillator 100 of FIG. 1 at the second terminal 118.

In some embodiments, the first realignment signal RLB is a square waveform or a pulse signal. Under the approaches of the instant disclosure, the first realignment signal RLB has a normal state and a realignment state that are repeated periodically. The first realignment signal RLB is (i) at a first logic level when it is in the realignment state, and (ii) at a second logic level when it is in the normal state. Accordingly, the voltage level of the first realignment signal RLB in the normal state is opposite to the voltage level of the first realignment signal RLB in the realignment state. In the embodiment of FIGS. 1 and 2A, the first logic level is low level, and the second logic level is high level.

As shown in FIGS. 1 and 2A, when the first realignment signal RLB is in the realignment state, the low level of the first realignment signal RLB is provided to the gate terminal 212 of the PMOS transistor 211. The low level of the first realignment signal RLB turns the PMOS transistor 211 on due to the low level at the gate terminal 212. When the PMOS transistor 211 is turned on, it allows current to flow from the node NVDD having operational voltage VDD through source terminal 214 and out drain terminal 218, thus increasing the voltage of the terminal 116 from a low level to a high level in order to align a phase of a waveform of the oscillator 100. Specifically, the voltage at the terminal 116 is increased to the voltage level VDD of the node NVDD.

The phase of the oscillator 100 is updated and aligned when the first realignment signal RLB is in the realignment state, and phase vibration caused by intrinsic device noise, power noise, and temperature vibration are reset. Therefore, the waveform at the terminal 116 of the oscillator 100 is adjusted and realigned when the first realignment signal RLB is in the realignment state (e.g., when the first realignment signal RLB has a low level). Under the approaches of the instant disclosure, the phase of the oscillator 100 is adjusted and realigned without adding an extra electronic component such as a multiplexer. Therefore, there is no additional phase delay or power consumption caused by an added electronic component.

By contrast, when the first realignment signal RLB is in the normal state, the high level of the first realignment signal RLB is provided to the gate terminal 212 of the PMOS transistor 211. The high level of the first realignment signal RLB turns the PMOS transistor 211 off due to the high level at the gate terminal 212. When the PMOS transistor 211 is turned off, no current flows through PMOS transistor 211 from source terminal 214 to drain terminal 218. Thus, the voltage at the terminal 116 oscillates at a resonant frequency of the oscillator 100 without being affected by the realignment circuit 102.

In some embodiments, the second realignment signal RL is a square waveform or a pulse signal, similar to the first realignment signal RLB. Further, in some embodiments, the second realignment signal RL includes a normal state and a realignment state that are repeated periodically, similar to the first realignment signal RLB. The second realignment signal RL is at (i) a first logic level when it is in the realignment state, and (ii) a second logic level when it is in the normal state. In the embodiment of FIGS. 1 and 2B, the first logic level is high level, and the second logic level is low level. In some embodiments, as shown in FIG. 1, the second realignment signal RL has a voltage level that is opposite to the voltage level of the first realignment signal RLB. Thus, the signals RLB and RL are complementary, such that when the first realignment signal RLB has a low logic level, the second realignment signal RL has a high logic level, and vice versa.

As shown in FIGS. 1 and 2B, when the second realignment signal RL is in the realignment state, the high level of the second realignment signal RL is provided to the gate terminal 222 of the NMOS transistor 221. The high level of the second realignment signal RL turns the NMOS transistor 221 on due to the high level at its gate terminal 222. When the NMOS transistor 221 is turned on, current can flow from terminal 118 of the oscillator 100 through drain terminal 228 and out of source terminal 224 into ground 226. This decreases the voltage of the terminal 118 from a high level to a low level in order to align a phase of a waveform of the oscillator 100. Specifically, the voltage at the terminal 118 is decreased to the voltage level of the ground 226. The phase of the oscillator 100 is updated and aligned when the second realignment signal RL is in the realignment state, and the phase vibration caused by intrinsic device noise, power noise, and temperature vibration of the oscillator 100 are reset. Therefore, the waveform at the terminal 118 of the oscillator 100 is adjusted and realigned when the second realignment signal RL is in the realignment state (e.g., when the second realignment signal RL has a low level). As explained above, the phase of the oscillator 100 is adjusted and realigned without adding an extra electronic component such as a multiplexer. Therefore, there is no additional phase delay or power consumption caused by an added electronic component.

By contrast, when the second realignment signal RL is in the normal state, the low level of the second realignment signal RL is provided to the gate terminal 222 of the NMOS transistor 221. The low level of the second realignment signal RL turns the NMOS transistor 221 off due to the low level at its gate terminal 222. When the NMOS transistor 221 is turned off, no current flows through NMOS transistor 221 from the drain terminal 228 to the source terminal 224 and into the terminal 118. Thus, the voltage at the terminal 118 oscillates at a resonant frequency of the oscillator 100 without being affected by the realignment circuit 104.

With reference again to FIG. 1, the first realignment signal RLB and the second realignment signal RL are generated by a pulse generator 106. The pulse generator 106 generates the first realignment signal RLB and the second realignment signal RL from a reference clock FREF, and as a result, the phases of both realignment signals RLB, RL are referenced to the phase of the reference clock FREF. In realigning the oscillator 100 based on the first realignment signal RLB and the second realignment signal RL as described above, the realignment is thus based on a high-quality reference clock FREF with a low phase noise and used to adjust the phase of the oscillator 100 to clean accumulated jitter. In some embodiments, the pulse generator 106 converts the reference clock FREF to a narrow clock pulse, such as a clock pulse with a width that is smaller than half a period of the resonant frequency of the oscillator 100. The operation and structure of the pulse generator 106 are described in further detail below.

In some embodiments, each of the realignment circuits 102, 104 of FIGS. 1, 2A, and 2B has a relatively small device size. Specifically, in some embodiments, the device size of each of the realignment circuits 102, 104 is relatively small (e.g., one-twentieth of the size of the first and second cross-coupled pairs described above with reference to FIG. 1), such that the realignment circuit 102 provides only a relatively weak pull up of the voltage level of the terminal 116, and the realignment circuit 104 provides only a relatively weak pull down of the voltage level of the terminal 118.

Figure 3:
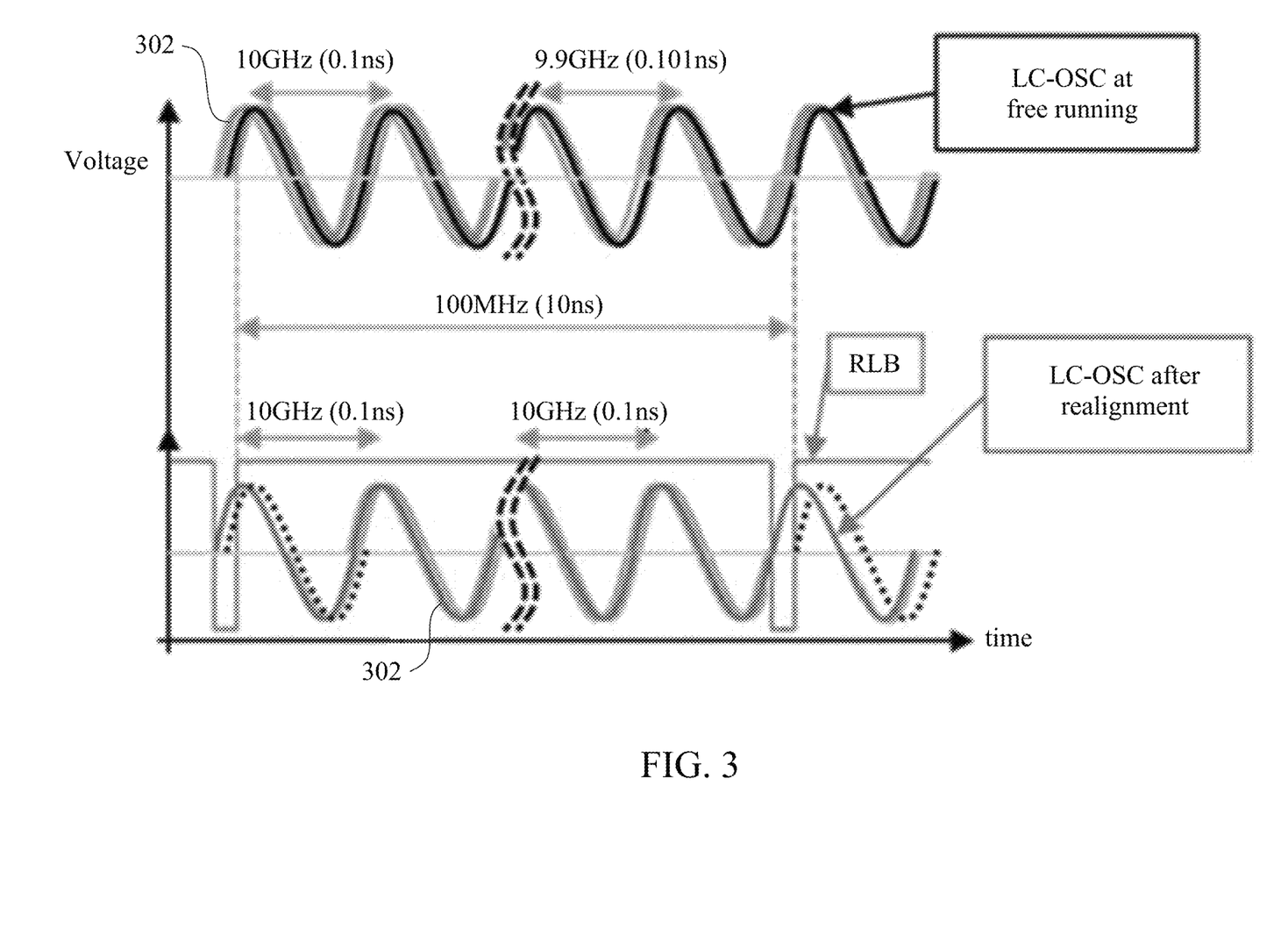
FIG. 3 depicts a timing diagram showing an effect of a realignment circuit, in accordance with some embodiments.

FIG. 3 depicts a timing diagram showing an effect of the realignment circuit 102 of the present disclosure. As depicted in the upper waveform 302 of FIG. 3, the oscillator 100 may exhibit frequency drifting at free running due to the intrinsic accumulated noise. Thus, for instance, the oscillator 100 may originally have a resonant frequency of 10.0 GHz and a period of 0.1 ns, but frequency drifting causes the resonant frequency to drift to 9.9 GHz with a period of 0.101 ns. But as depicted in the lower waveform 304 of FIG. 3, the first realignment signal RLB weakly adjusts the phase of the oscillator 100 for realignment and thus prevents or corrects the frequency drifting. Specifically, the first realignment signal RLB turns on the realignment circuit 102 to pull up the voltage of the terminal 116, which cleans the intrinsic accumulated jitter of the oscillator 100 and improves in-band noise of the oscillator 100.

Although FIG. 3 depicts the effect of the first realignment signal RLB in realigning the oscillator 100, the second realignment signal RL provides realignment in a similar manner. The second realignment signal RL turns on the realignment circuit 104 to pull down the voltage of the terminal 118, as explained above, thus cleaning the intrinsic accumulated jitter of the oscillator 100 and improving in-band noise of the oscillator 100.

Figure 4:
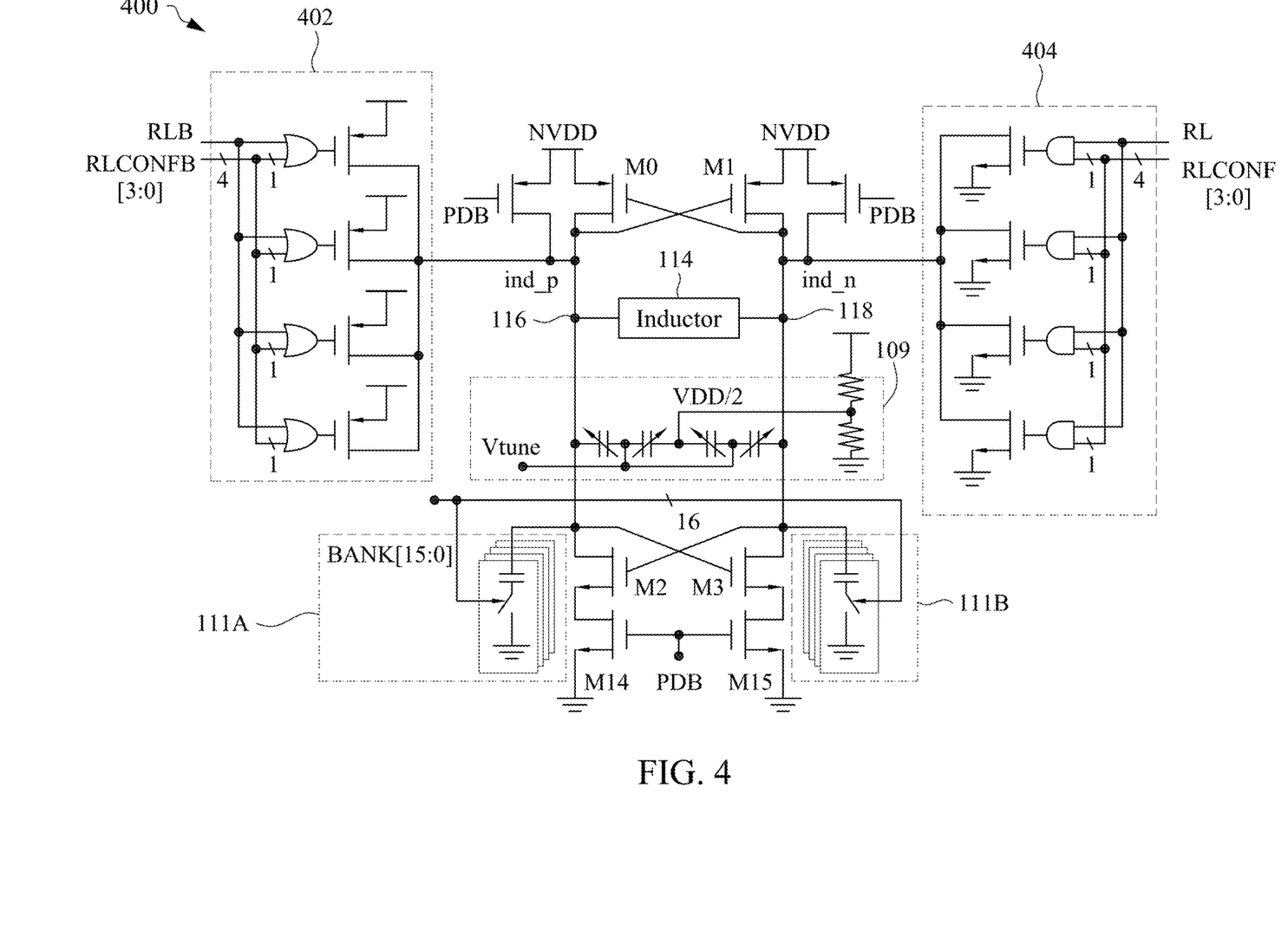
FIG. 4 is a schematic diagram of an oscillator, in accordance with some embodiments.

FIG. 4 is a schematic diagram of an oscillator 400, in accordance with some embodiments. The oscillator 400 of FIG. 4 is similar to the oscillator 100 of FIG. 1, and like reference numerals indicate corresponding parts in the different drawings. However, in the oscillator 400 of FIG. 4, realignment is provided by realignment circuits 402, 404 that are different than the realignment circuits 102, 104 of FIG. 1. Specifically, the realignment circuits 402, 404 enable a strength of the realignment to be adjusted.

In the example of FIG. 4, the realignment circuit 402 comprises transistors of a first conductivity type (e.g., PMOS) and logic gates of a first type (e.g., OR gates). The realignment circuit 402 receives the first realignment signal RLB, as described above with reference to FIGS. 1, 2A, 2B, and 3, and further receives a 4-bit signal RLCONFB[3:0]. As explained in further detail below, the logic gates of the realignment circuit 402 gate the first realignment signal RLB based on the 4-bit signal RLCONFB[3:0] in a manner that enables the realignment strength of the realignment circuit 402 to be controlled. In the example of FIG. 4, the realignment circuit 404 comprises transistors of a second conductivity type (e.g., NMOS) and logic gates of a second type (e.g., AND gates). The realignment circuit 404 receives the second realignment signal RL, as described above with reference to FIGS. 1, 2A, 2B, and 3, and further receives a 4-bit signal RLCONF[3:0]. The logic gates of the realignment circuit 404 gate the second realignment signal RL based on the RLCONF[3:0] signal in a manner that enables the realignment strength of the realignment circuit 404 to be controlled.

Figure 5A:
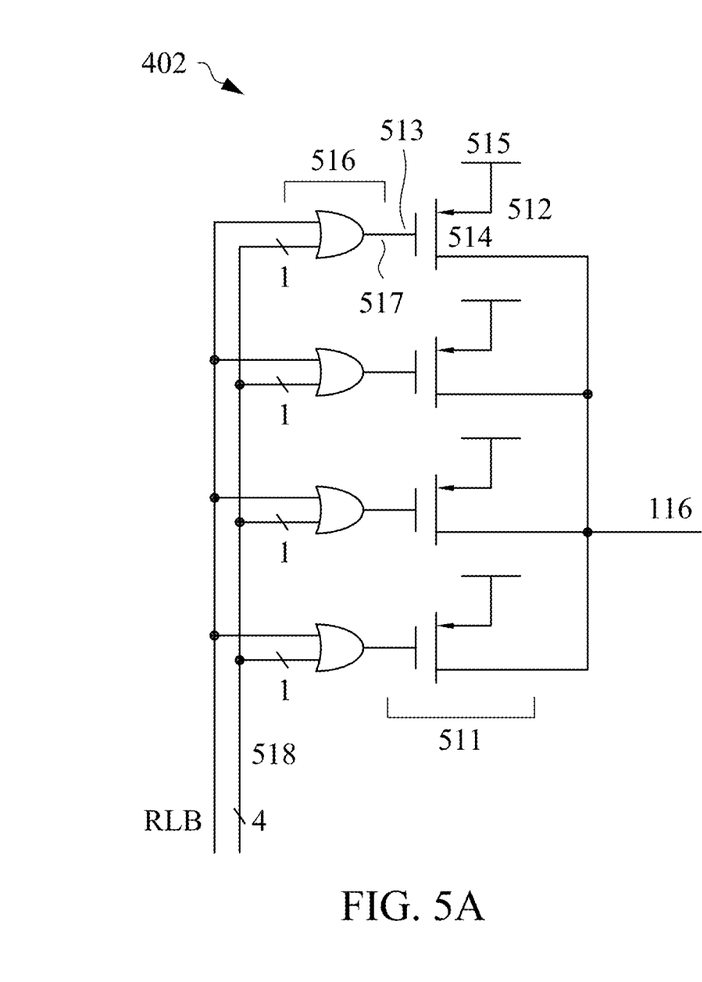
FIGS. 5A and 5B depict example realignment circuits, in accordance with some embodiments.

An example of the realignment circuit 402 is illustrated in FIG. 5A. In this figure, the realignment circuit 402 includes a plurality of PMOS transistors 511 and an array of logic OR gates 516 for selectively activating the PMOS transistors 511. The example realignment circuit 402 of FIG. 5A includes four PMOS transistors 511 and four corresponding OR gates 516, but other numbers of PMOS transistors and corresponding OR gates are used in other embodiments to provide for a variety of resolutions of realignment strength control.

A first strength control word 518 is received by the realignment circuit 402. In the example of FIGS. 4 and 5A, the first strength control word 518 includes four bits, and each of the bits is received by a respective OR gate of the array of logic OR gates 516. All of the OR gates of the array 516 further receive the first realignment signal RLB. Each OR gate of the array 516 has a respective output 517 electrically coupled to a respective gate 513 of a corresponding PMOS transistor of the plurality of PMOS transistors 511. Each PMOS transistor of the plurality of PMOS transistors 511 also has (i) a respective source terminal 512 electrically coupled to voltage source 515, and (ii) a respective drain terminal 514 electrically coupled to the terminal 116 of the oscillator 400 depicted in FIG. 4.

When the first realignment signal RLB is in its normal state with a high logic level, all of the OR gates 516 output a logic high signal and thus turn off all of the PMOS transistors 511. When the PMOS transistors 511 are turned off, no current flows through the PMOS transistors 511 from source terminals 512 to drain terminals 514. Thus, the voltage at the terminal 116 oscillates at a resonant frequency of the oscillator 400 without being affected by the realignment circuit 402.

When the first realignment signal RLB is in its realignment state with a low logic level, the realignment circuit 402 provides realignment with the strength of the realignment being determined by the first strength control word 518. Specifically, each OR gate of the OR gates 516 that receives a logic high input from the strength control word 518 outputs a logic high signal, and therefore turns off the corresponding PMOS transistor 511 that receives the logic high signal at its gate. Each OR gate of the OR gates 516 that receives a logic low input from the strength control word 518 outputs a logic low signal when the first realignment signal RLB is in its realignment state, and therefore turns on the corresponding PMOS transistor 511 that receives the logic low signal at its gate. The PMOS transistors 511 that are turned on pull up the voltage of terminal 116 by supplying current from voltage source 515 through source terminal 512, out drain terminal 514 and into terminal 116. The PMOS transistors 511 that are turned off do not pull up the voltage of the terminal 116 and thus do not contribute to the realignment.

In this way, the strength of the realignment circuit 402 is controlled by the first strength control word 518 because if there are more logic low bits in the first strength control word 518, then more PMOS transistors 511 are turned on when the first realignment signal RLB is in its realignment state (e.g., logic level low). Turning on a greater number of the PMOS transistors 511 results in a larger impact of the realignment circuit 402 because the additional turned on PMOS transistors 511 supply more current to terminal 116, which causes the voltage of the terminal 116 to be pulled up more quickly towards the voltage of voltage source 515.

Figure 5B:
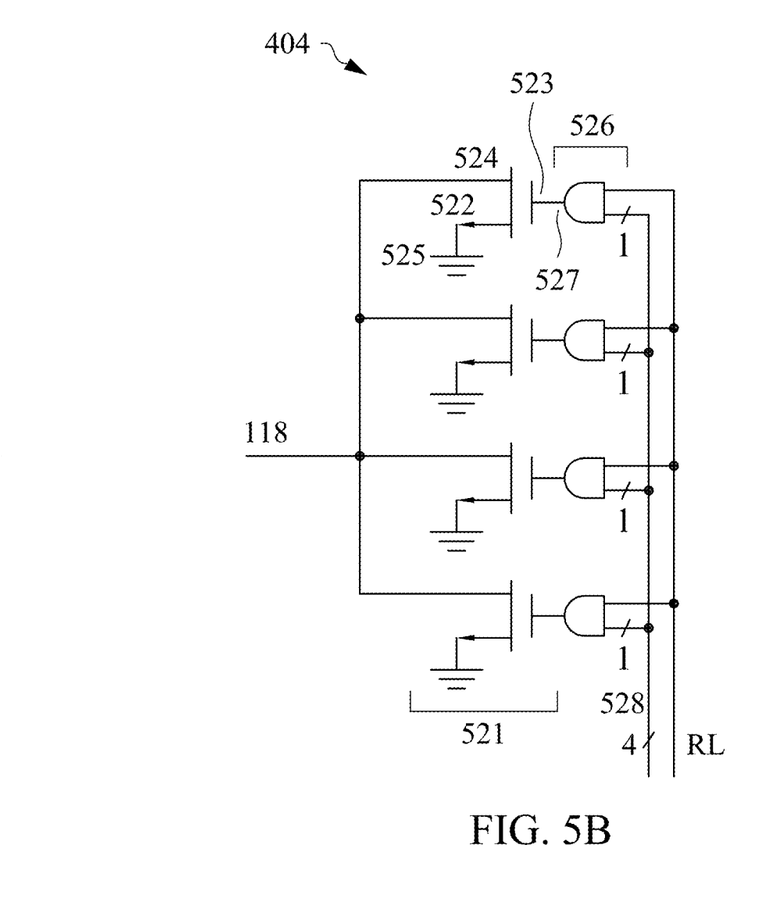

An example of the realignment circuit 404 is illustrated in FIG. 5B. In this figure, the realignment circuit 404 includes a plurality of NMOS transistors 521 and an array of logic AND gates 526 for selectively activating the NMOS transistors 521. The example realignment circuit 404 of FIG. 5B includes four NMOS transistors 521 and four corresponding AND gates 526, but other numbers of NMOS transistors and corresponding AND gates are used in other embodiments to provide for a variety of resolutions of realignment strength control.

A second strength control word 528 is received by the realignment circuit 404. In the example of FIGS. 4 and 5B, the second strength control word 528 includes four bits, and each of the bits is received by a respective AND gate of the array of logic AND gates 526. All of the AND gates of the array 526 further receive the second realignment signal RL. Each AND gate of the array 526 has a respective output 527 electrically coupled to a respective gate 523 of a corresponding NMOS transistor of the plurality of NMOS transistors 521. Each NMOS transistor of the plurality of NMOS transistors 521 also has (i) a respective source terminal 522 electrically coupled to electrical ground 525, and (ii) a respective drain terminal 524 electrically coupled to the terminal 118 of the oscillator 400 depicted in FIG. 4.

When the second realignment signal RL is in its normal state with a low logic level, all of the AND gates 526 output a logic low signal and thus turn off all of the NMOS transistors 521. When the NMOS transistors 521 are turned off, no current flows through the NMOS transistors 521 from drain terminals 524 to source terminals 522. Thus, the voltage at the terminal 118 oscillates at a resonant frequency of the oscillator 400 without being affected by the realignment circuit 404.

When the second realignment signal RL is in its realignment state with a high logic level, the realignment circuit 404 provides realignment with the strength of the realignment being determined by the second strength control word 528. Specifically, each AND gate of the AND gates 526 that receives a logic low input from the strength control word 528 outputs a logic low signal, and therefore turns off the corresponding NMOS transistor 521 that receives the logic low signal at its gate. Each AND gate of the AND gates 526 that receives a logic high input from the strength control word 528 outputs a logic high signal when the second realignment signal RL is in its realignment state, and therefore turns on the corresponding NMOS transistor 521 that receives the logic high signal at its gate. The NMOS transistors 521 that are turned on pull down the voltage of the terminal 118 by supplying current from the drain terminal 524 through the source terminal 522 and into the electrical ground 525. The NMOS transistors 521 that are turned off do not pull down the voltage of the terminal 118 and thus do not contribute to the realignment.

In this way, the strength of the realignment circuit 404 is controlled by the second strength control word 528 because if there are more logic high bits in the second strength control word 528, then more NMOS transistors 521 will be turned on when the second realignment signal RL is in its realignment state (e.g., logic level high). Turning on a greater number of the NMOS transistors 521 results in a larger impact of the realignment circuit 404 because the additional turned on NMOS transistors 521 cause the voltage of the terminal 118 to be pulled down more quickly towards the voltage of the electrical ground 525.

Figure 6:
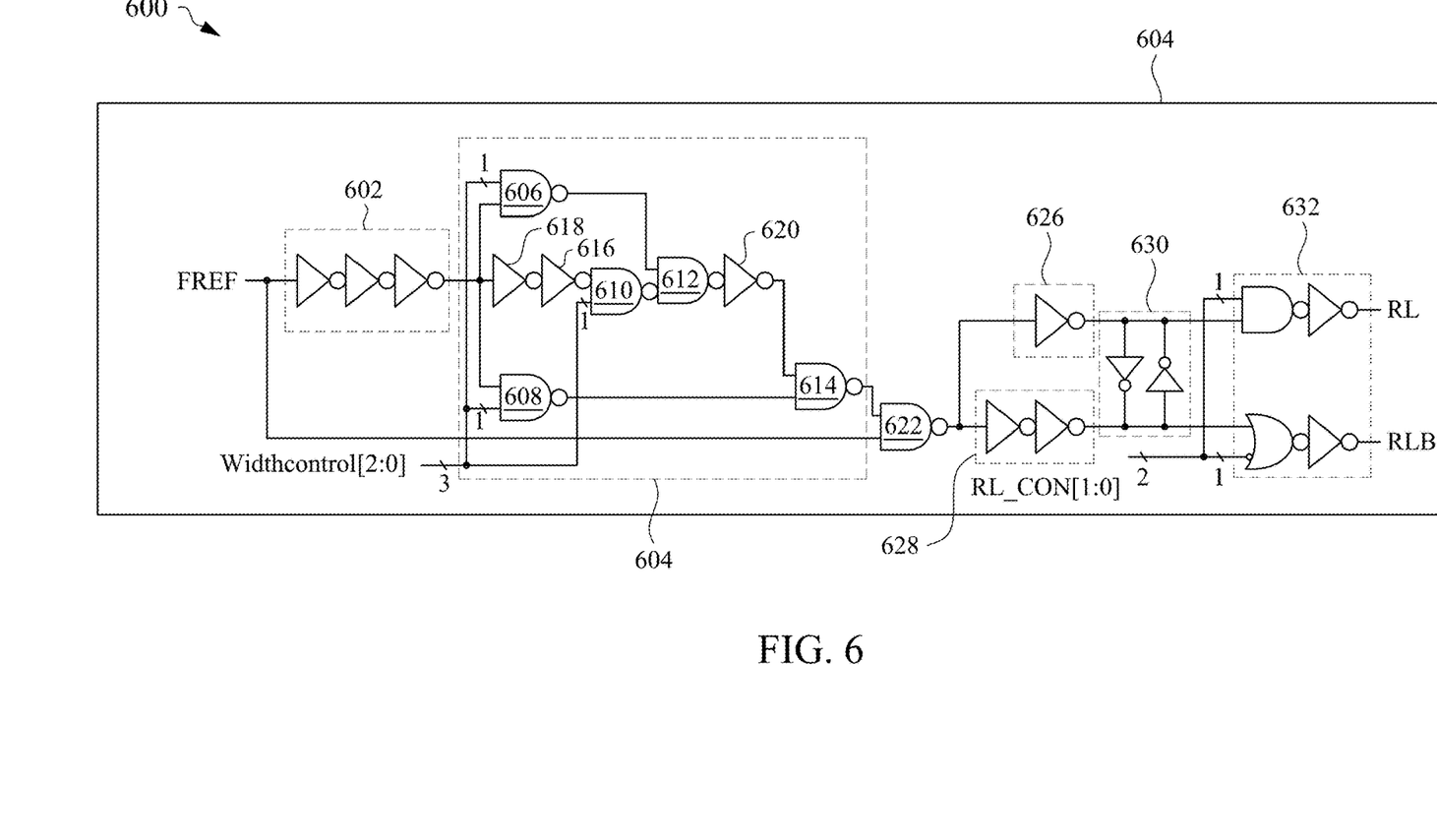
FIG. 6 is a schematic diagram of a pulse generator, in accordance with some embodiments.

FIG. 6 is a schematic diagram of a pulse generator 600, in accordance with some embodiments. The pulse generator 600 may be used, for instance, as the pulse generator 106 for generating the realignment signals RLB, RL shown in FIG. 1. The pulse generator 600 may also be used to generate the realignment signals RLB, RL discussed above with reference to FIGS. 4, 5A, and 5B.

In the pulse generator 600 of FIG. 6, a reference clock FREF is received by an inverter train 602, which operates to delay and invert the reference clock FREF. In some embodiments, the reference clock FREF is a high-quality clock signal with low phase noise, and the pulse generator 600 processes the high-quality clock signal to generate the realignment signals RLB, RL having relatively narrow pulses that are repeated periodically. In some embodiments, the pulses of the realignment signals RLB, RL have widths that are less than one half of the period of the oscillator (e.g., the oscillator 100, the oscillator 400). The delayed and inverted version of the reference clock signal FREF is received by a width control circuit 604 that includes NAND gates 606, 608, 610, 612, 614 and inverters 616, 618, 620 electrically coupled together as shown in the drawing. The width control circuit 604 also receives a three-bit width control signal [2:0] and uses this received signal to control the width of the pulses generated by the pulse generator 600.

As seen in the example embodiment of FIG. 6, a first bit of the three-bit width control signal [2:0] is received at the NAND gate 606, a second bit of the three-bit width control signal [2:0] is received at the NAND gate 608, and a third bit of the three-bit width control signal [2:0] is received at the NAND gate 610. The table below illustrates an example scheme by which the three-bit width control signal [2:0] may be used to control the width of the pulses generated by the pulse generator 600:

| Width control[2.0] | Pulse width |
| --- | --- |
| 3'b001 | Level0 (narrow) |
| 3'b010 | Level1 (middle) |
| 3'b100 | Level2 (wide) |

As seen in the table above, in this example, if the first bit (e.g., least-significant bit) is high (e.g., logic-level high or "1"), and the second and third bits are low (e.g., logic-level low or "0"), then the pulse signal generated by the pulse generator 600 has a first width (e.g., a narrowest width). Further, in this example, if the third bit (e.g., most-significant bit) is high, and the first and second bits are low, then the pulse signal generated by the pulse generator 600 has a second width (e.g., a widest width). Additionally, in this example, if the second bit is high, and the first and third bits are low, then the pulse signal generated by the pulse generator 600 has a third width (e.g., a medium width that is between the aforementioned narrowest and widest widths).

The output of the width control circuit 604 is received by the NAND gate 622, which also receives the FREF reference clock signal. The NAND gate 622 processes the two inputs to generate a single-ended output signal that is received by a single-to-differential (S2D) unit 624.

According to some embodiments, the S2D unit 624 converts the single-ended output signal to differential signals RL and RLB. The differential signals RL and RLB may be used as complementary realignment signals, as described above with reference to the preceding figures. The S2D unit 624 includes an even-staged inverter train 628, an odd-staged inverter train 626, and a crossing latch unit 630. According to some embodiments, the even-staged inverter train 628 includes an even number (e.g., 2, 4, etc.) of serially connected inverters, and the odd-staged inverter train 610 includes an odd number (e.g., 1, 3) of serially connected inverters. The crossing latch unit 630 includes a pair of cross-connected inverters as shown in FIG. 6. The respective outputs of the inverter trains 626, 628 are received by the crossing latch unit 630, and the outputs of the crossing latch unit 630 are received by a circuit 632 including a NAND gate, NOR gate, and two inverters electrically coupled as shown in the figure.

The circuit 632 further receives a two-bit control signal RL_CON[1:0] and controls the output of the RL and RLB realignment signals based on that control signal. Specifically, the example pulse generator 600 of FIG. 6 uses the two-bit control signal RL_CON[1:0] to control whether (i) the realignment signals RL and RLB are both off, (ii) the realignment signals RL and RLB are both on, or (iii) one of the realignment signals RL, RLB is turned on and the other signal is turned off. In this manner, the pulse generator 600 can output one, both, or neither of the realignment signals RL, RLB to control the realignment strength of the oscillator.

When both of the realignment signals RL, RLB are turned off, the oscillator oscillates at it its intrinsic oscillation frequency and is not affected by either of the realignment circuits. In FIG. 1, for instance, when both of the realignment signals RL, RLB are turned off, neither of the realignment circuits 102, 104 have an effect on the oscillation frequency of the oscillator. By contrast, when both of the realignment signals RL, RLB are turned on, both of the realignment circuits 102, 104 provide realignment for the oscillator. Finally, when a single one of the realignment signals RL, RLB is turned on, only one of the realignment circuits 102, 104 provides realignment for the oscillator.

The table below illustrates an example scheme by which the two-bit control signal RL_CON[1:0] may be used to enable one, both, or neither of the realignment signals RL, RLB:

| S2D-C RL CON[1:0] | RL/RLB |
| --- | --- |
| 2'b00 | RL & RLB "OFF" |
| 2'b01 | RL "ON", RLB "OFF" |
| 2'b10 | RL "OFF", RLB "ON" |
| 2'b11 | RL & RLB "ON" |

As seen in the table above, in this example, when both bits of the control signal RL_CON[1:0] are low, both of the realignment signals RL, RLB are turned off. When both bits of the control signal RL_CON[1:0] are high, both of the realignment signals RL, RLB are turned on. Finally, when one bit of the control signal RL_CON[1:0] is low and the other bit is high, one of the realignment signals RL, RLB is turned on while the other signal is turned off.

Figure 7A:
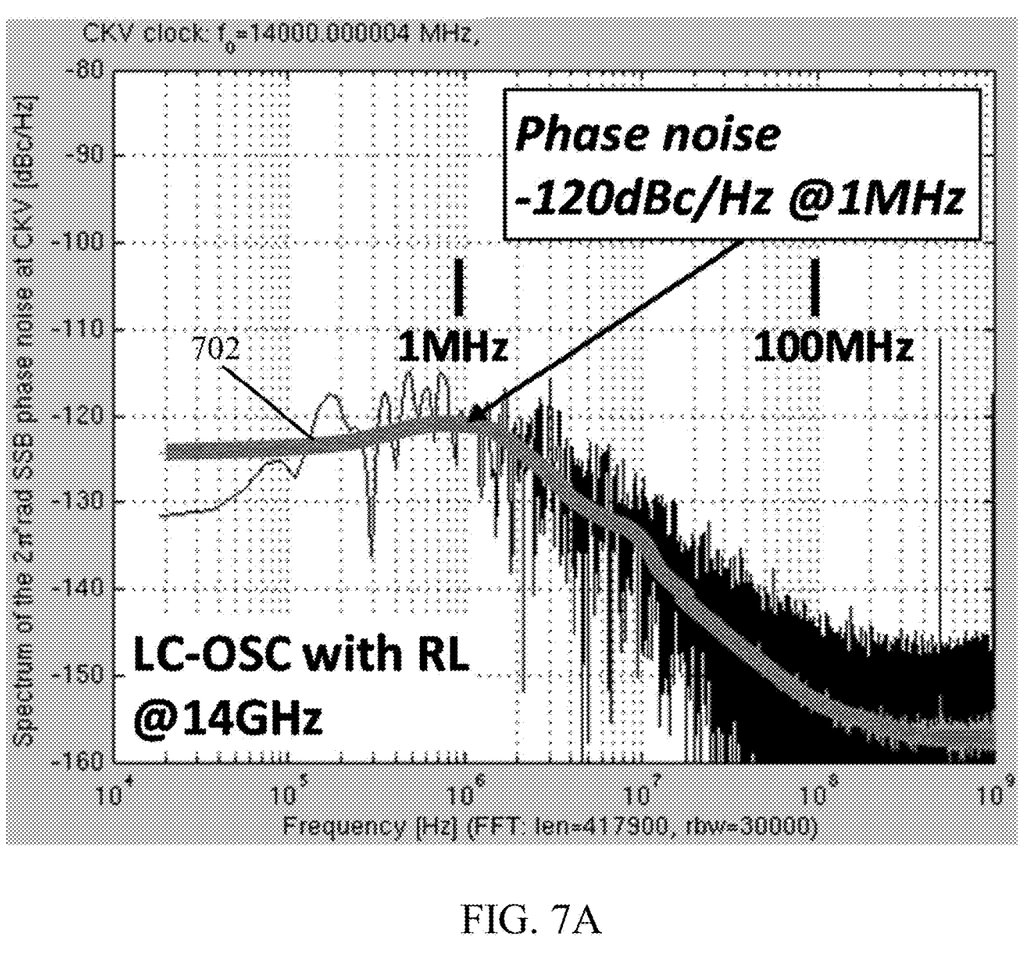
FIGS. 7A and 7B illustrate a comparison of phase noise suppression, in accordance with some embodiments.
Figure 7B:
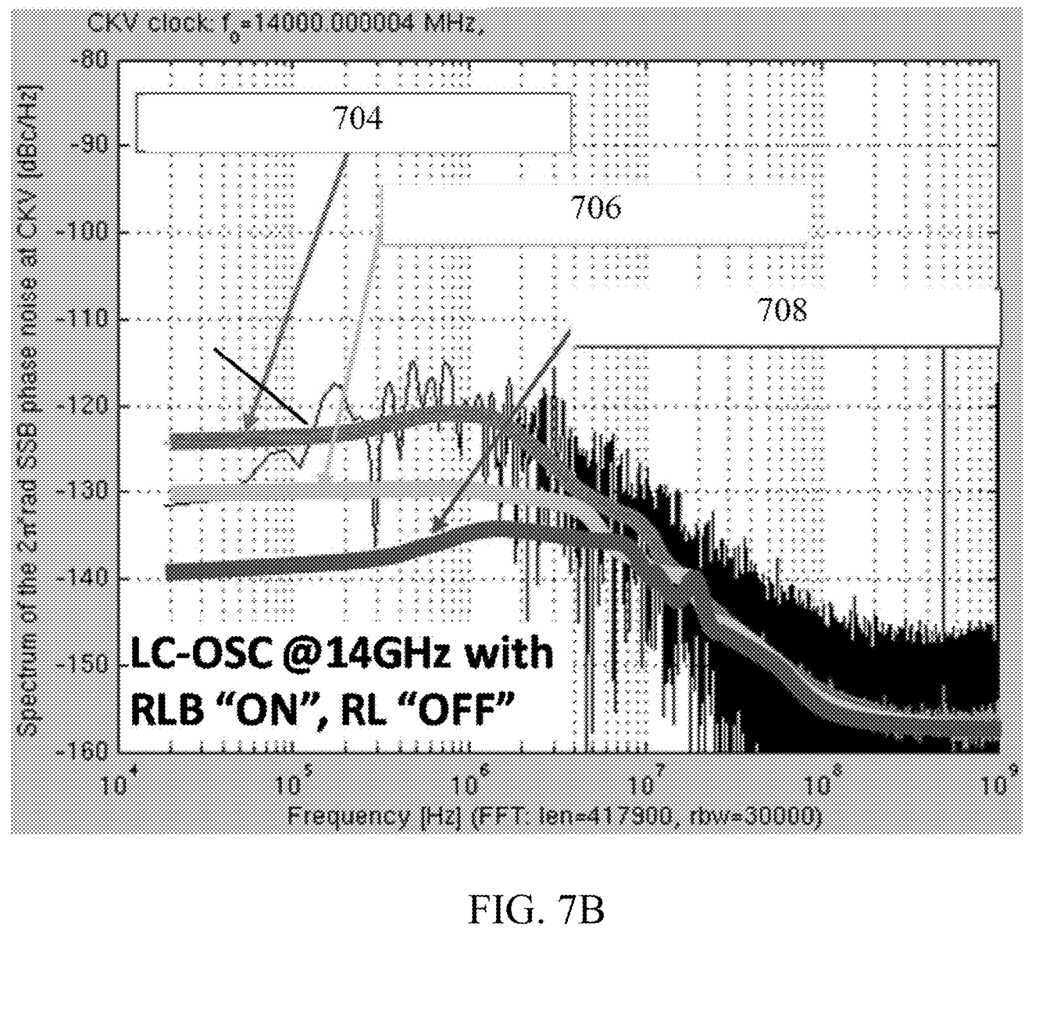

FIGS. 7A and 7B illustrate a comparison of phase noise suppression, in accordance with some embodiments. According to some embodiments, FIGS. 7A and 7B illustrate a comparison of phase noise among the pure oscillator (as shown in FIG. 7A) and the oscillator with the realignment signal RLB at three different widths (as shown in FIG. 7B). The realignment signal RL is turned off in the comparison of FIGS. 7A and 7B. The phase noise of a pure oscillator is represented by curve 702 with −108 dBc/Hz. The phase noise of the oscillator with the realignment signal RLB having a relatively narrow pulse width is represented by the curve 704, and the phase noise of the oscillator with the realignment signal RLB having a relatively wide pulse is represented by the curve 708. The phase noise of the oscillator with the realignment signal RLB having a width between the relatively narrow and wide pulse widths is represented by the curve 706. When the realignment signal has its widest width, the noise floor of in-band noise (<100 MHz) can reach its lowest level of approximately −140 dBc/Hz, as seen in the figure. The wider pulse thus provides a high realignment strength but may distort the oscillating waveform and thus cause increased cycle-to-cycle jitter.

Figure 8:
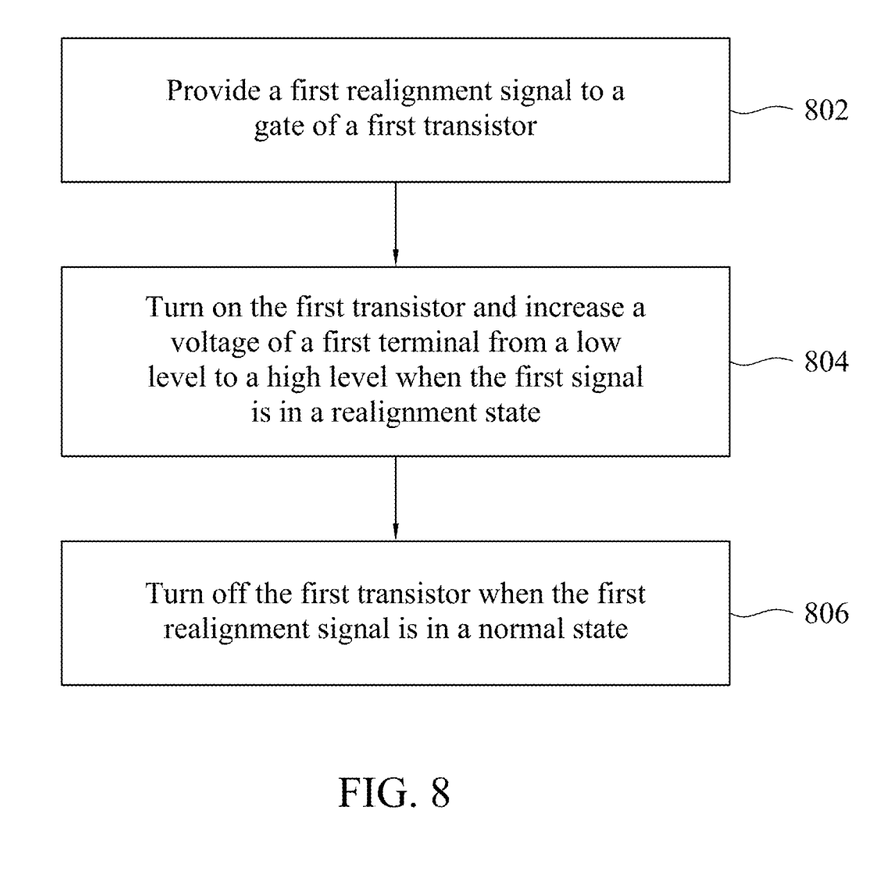
FIG. 8 depicts operations of an example method for realigning an oscillator, in accordance with some embodiments.

FIG. 8 depicts operations of an example method for realigning an oscillator, in accordance with some embodiments. FIG. 8 is described with reference to FIG. 1 above for ease of understanding. But the process of FIG. 8 is applicable to other circuits as well. The oscillator (e.g., oscillator 100) includes an inductor (e.g., inductor 114) having first and second terminals (e.g., first and second terminals 116, 118) and a capacitor (e.g., a capacitor comprising varactor capacitors 109 and a MOM capacitor array with banks of capacitors 111A, 111B) electrically coupled in parallel to the inductor at the first and second terminals. The oscillator also includes a first transistor (e.g., a transistor of the realignment circuit 102) of a first conductivity type (e.g., P-type) coupled to the first terminal. At 802, a first realignment signal (e.g., realignment signal RLB) is provided to a gate of the first transistor. The first realignment signal includes a realignment state (e.g., a state where the first realignment signal is logic level low) and a normal state (e.g., a state where the first realignment signal is logic level high), and a voltage level of the first realignment signal in the normal state is opposite to the voltage level of the first realignment signal in the realignment state. At 804, when the first realignment signal is in the realignment state, the first transistor is turned on, and a voltage of the first terminal is increased from a low level to a high level in order to align a phase of a waveform of the oscillator. At 806, the first transistor is turned off when the first realignment signal is in the normal state.

The present disclosure is directed to oscillators and methods for realignment of oscillators. An example oscillator includes an inductor having first and second terminals and a capacitor electrically coupled in parallel to the inductor at the first and second terminals. The example oscillator also includes a first transistor of a first conductivity type that is electrically coupled to the first terminal and a voltage source. The first transistor includes a gate configured to receive a first realignment signal. When the first realignment signal is in a realignment state, the first transistor is turned on and a voltage of the first terminal is increased from a low level to a high level in order to align a phase of a waveform of the oscillator.

Another example oscillator includes an inductor having first and second terminals and a capacitor electrically coupled in parallel to the inductor at the first and second terminals. The example oscillator also includes a plurality of first transistors of a first conductivity type, each of the first transistors being electrically coupled to the first terminal and a voltage source and having a gate that is configured to receive a first realignment signal. When the first realignment signal is in a realignment state, the voltage of the first terminal is increased from a low level to a high level in order to align a phase of a waveform of the oscillator.

In an example method for realigning an oscillator that comprises an inductor having first and second terminals, a capacitor electrically coupled in parallel to the inductor at the first and second terminals, and a first transistor of a first conductivity type coupled to the first terminal, a first realignment signal is provided to a gate of the first transistor. The first realignment signal includes a realignment state and a normal state, and a voltage level of the first realignment signal in the normal state is opposite to the voltage level of the first realignment signal in the realignment state. When the first realignment signal is in the realignment state, the first transistor is turned on, and a voltage of the first terminal is increased from a low level to a high level in order to align a phase of a waveform of the oscillator. The first transistor is turned off when the first realignment signal is in the normal state.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An oscillator comprising:
   an inductor having first and second terminals;
   a capacitor electrically coupled in parallel to the inductor at the first and second terminals; and
   a first transistor of a first conductivity type that (i) is electrically coupled to the first terminal and a voltage source, and (ii) includes a gate configured to receive a first realignment signal, the first transistor being turned on and a voltage of the first terminal being increased from a low level to a high level in order to align a phase of a waveform of the oscillator when the first realignment signal is in a realignment state.

2. The oscillator of claim 1, wherein a drain of the first transistor is electrically coupled to the first terminal, and a source of the first transistor is electrically coupled to the voltage source.

3. The oscillator of claim 1, wherein when the first realignment signal is in the realignment state, the voltage of the first terminal is increased to a voltage level of the voltage source.

4. The oscillator of claim 1, wherein
   when the first realignment signal is in a normal state, the first transistor is turned off, and
   a voltage level of the first realignment signal in the normal state is opposite to the voltage level of the first realignment signal in the realignment state.

5. The oscillator of claim 1 further comprising:
   a second transistor of a second conductivity type that (i) is electrically coupled to the second terminal and ground, and (ii) includes a gate that is configured to receive a second realignment signal, wherein when the second realignment signal is in a realignment state, the second transistor is turned on and a voltage of the second terminal is decreased from a high level to a low level in order to align the phase of the waveform of the oscillator.

6. The oscillator of claim 5, wherein a drain of the second transistor is electrically coupled to the second terminal, and a source of the second transistor is electrically coupled to the ground.

7. The oscillator of claim 5, wherein when the second realignment signal is in the realignment state, the voltage of the second terminal is decreased to a voltage level of the ground.

8. The oscillator of claim 5, wherein
   when the second realignment signal is in a normal state, the second transistor is turned off, and
   a voltage level of the second realignment signal in the normal state is opposite to the voltage level of the second realignment signal in the realignment state.

9. The oscillator of claim 5, wherein the first conductivity type is P-type, the second conductivity type is N-type.

10. The oscillator of claim 5 further comprising:
    a pulse generator configured to (i) receive a clock signal, and (ii) generate the first realignment signal and the second realignment signal as differential signals based on the clock signal.

11. An oscillator comprising:
    an inductor having first and second terminals;

a capacitor electrically coupled in parallel to the inductor at the first and second terminals;

a plurality of first transistors of a first conductivity type, each of the first transistors (i) being electrically coupled to the first terminal and a voltage source, and (ii) having a gate that is configured to receive a first realignment signal, the voltage of the first terminal being increased from a low level to a high level in order to align a phase of a waveform of the oscillator when the first realignment signal is in a realignment state; and a first circuit configured to gate the first realignment signal based on a first control signal to selectively provide the first realignment signal to the gates of the plurality of first transistors.

12. The oscillator of claim 11, wherein the first circuit comprises an array of OR gates.

13. The oscillator of claim 11, wherein the first control signal enables the first realignment signal to be provided to selected gates of the plurality of first transistors while not providing the first realignment signal to non-selected gates of the plurality of first transistors.

14. The oscillator of claim 11 further comprising:

a plurality of second transistors of a second conductivity type, each of the second transistors (i) being electrically coupled to the second terminal and ground, and (ii) having a gate that is configured to receive a second realignment signal, wherein when the second realignment signal is in a realignment state, a voltage of the second terminal is decreased from a high level to a low level in order to align the phase of the waveform of the oscillator; and a second circuit configured to gate the second realignment signal based on a second control signal to selectively provide the second realignment signal to the gates of the plurality of second transistors.

15. The oscillator of claim 14, wherein the first conductivity type is P-type, the second conductivity type is N-type.

16. The oscillator of claim 14 further comprising:

a pulse generator configured to (i) receive a clock signal, and (ii) generate the first realignment signal and the second realignment signal as differential signals based on the clock signal.

17. A method for realigning an oscillator that comprises an inductor having first and second terminals, a capacitor electrically coupled in parallel to the inductor at the first and second terminals, and a first transistor of a first conductivity type coupled to the first terminal, the method comprising:

providing a first realignment signal to a gate of the first transistor, the first realignment signal including a realignment state and a normal state, and a voltage level of the first realignment signal in the normal state being opposite to the voltage level of the first realignment signal in the realignment state;

when the first realignment signal is in the realignment state, turning on the first transistor and increasing a voltage of the first terminal from a low level to a high level in order to align a phase of a waveform of the oscillator; and turning off the first transistor when the first realignment signal is in the normal state.

18. The method of claim 17, wherein the oscillator comprises a second transistor of a second conductivity type coupled to the second terminal, the method further comprising:

providing a second realignment signal to a gate of the second transistor, the second realignment signal including a realignment state and a normal state, and a voltage level of the second realignment signal in the normal state being opposite to the voltage level of the second realignment signal in the realignment state; and when the second realignment signal is in the realignment state, turning on the second transistor and decreasing a voltage of the second terminal from a high level to a low level in order to align the phase of the waveform of the oscillator.

19. The method of claim 18, further comprising turning off the second transistor when the second realignment signal is in the normal state.

20. The method of claim 18, wherein the oscillator comprises a pulse generator, the method further comprising:

providing a clock signal to the pulse generator; and using the pulse generator to generate the first realignment signal and the second realignment signal as differential signals based on the clock signal.

* * * * *